United States Patent [19]

Smith et al.

[11] 4,217,600
[45] Aug. 12, 1980

[54] CHARGE TRANSFER LOGIC APPARATUS

[75] Inventors: George E. Smith, Murray Hill; Michael F. Tompsett, Summit, both of N.J.

[73] Assignee: Bell Telephone Laboratories, Incorporated, Murray Hill, N.J.

[21] Appl. No.: 114,625

[22] Filed: Feb. 11, 1971

Related U.S. Application Data

[63] Continuation-in-part of Ser. No. 82,959, Oct. 22, 1970, abandoned.

[51] Int. Cl.² .................... H01L 27/04; G11C 19/28
[52] U.S. Cl. .................................... 357/24; 307/215; 307/221 D
[58] Field of Search ............... 357/24, 23; 307/221 D, 307/304

[56] References Cited

U.S. PATENT DOCUMENTS

| 3,591,836 | 7/1971 | Booher et al. | 317/235 |
| 3,602,731 | 8/1971 | Yanai et al. | 317/235 |
| 3,651,349 | 3/1972 | Kahng et al. | 317/235 |
| 3,758,794 | 9/1973 | Kosonocky | 357/24 |
| 3,858,232 | 12/1974 | Boyle et al. | 357/24 |
| 3,988,773 | 10/1976 | Engeler et al. | 357/24 |

*Primary Examiner*—William D. Larkins
*Attorney, Agent, or Firm*—Lester H. Birnbaum; George W. Houseweart

[57] ABSTRACT

Charge transfer devices are adapted to provide all possible forms of combinational logic functions by using combinations and variations of a basic state inversion-bit regeneration element. This basic element employs electrically floating means in the vicinity of a charge transfer device to sense the presence or absence of charge therein and to control the transfer of a newly-generated amount of charge away from an independent source.

19 Claims, 17 Drawing Figures

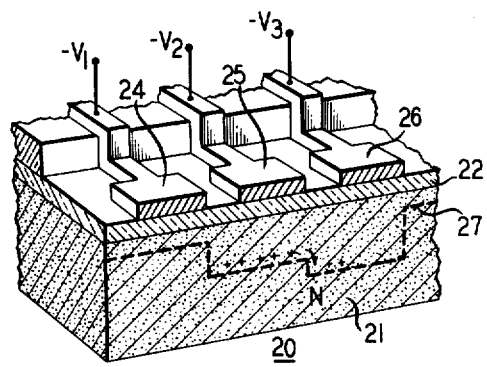
FIG. 1
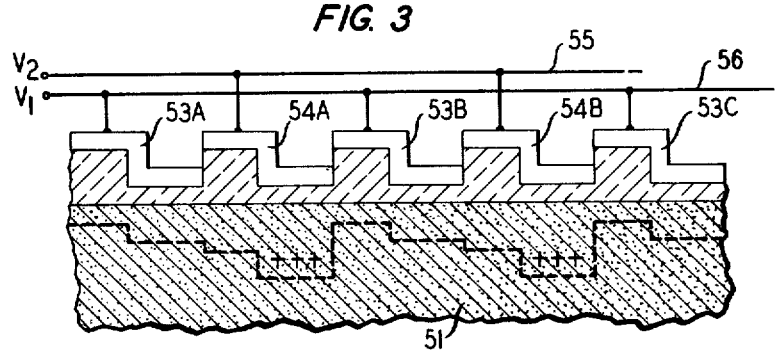
FIG. 3
FIG. 2A
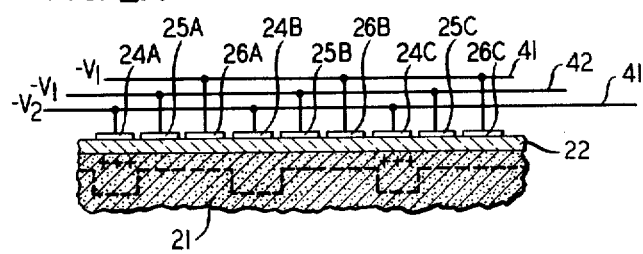
FIG. 2B
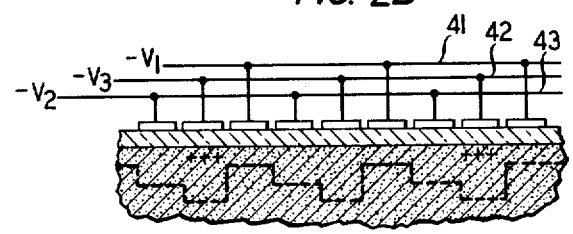
FIG. 2C
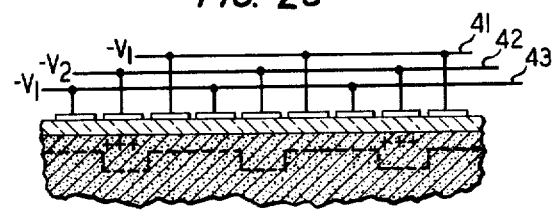

CHARGE TRANSFER LOGIC APPARATUS

CROSS-REFERENCE TO RELATED APPLICATION

This application is a continuation-in-part of our co-pending application, Ser. No. 82,959, filed Oct. 22, 1970, now abandoned.

BACKGROUND OF THE INVENTION

This invention relates to semiconductor devices; and, more particularly, to charge transfer devices capable of providing logic state inversion and bit regeneration.

One form of charge transfer devices, which has been termed "charge coupled devices," was first described in the copending U.S. patent application Ser. No. 11,541, filed Feb. 16, 1970, by W. S. Boyle and G. E. Smith, U.S. Pat. No. 3,858,232 and in the copending U.S. patent application Ser. No. 11,448, filed on the same date by D. Kahng and E. H. Nicollian now U.S. Pat. No. 3,651,349, issued Mar. 21, 1972. In these devices information is represented by electronic signals in the form of packets of charge carriers localized by induced potential energy minima in suitable storage media such as semiconductors, semi-insulating semiconductors, and insulators. Those copending applications specifically describe primarily a basic shift-register type of operation in which information is moved within the material by transferring the packets of charge sequentially from each potential well to the one next adjacent.

In another form of charge transfer devices, described in the copending U.S. application Ser. No. 11,447, filed Feb. 16, 1970, by C. N. Berglund and H. J. Boll, now U.S. Pat. No. 3,660,697, issued May 2, 1972 packets of charge carriers are gated sequentially from zone to zone along the surface of a semiconductive body which includes a bulk portion of one type semiconductivity and a plurality of spaced localized zones of the other type semiconductivity. In these devices each zone is operated as a potential well, the boundary of which is defined by the PN junction which defines the zone. This Berglund-Boll type of charge transfer apparatus is presently being referred to as the "bucket-brigade" type by those in the art; and so that designation will be used hereinbelow.

A problem early recognized in charge transfer devices is that a small fraction of the charge from each packet is left behind each time a packet is transferred from one potential well to another. Inasmuch as this charge loss results in signal degradation, some form of controlled charge regeneration and/or amplification must be provided if very long strings of information are to be so stored and processed.

And, of course, it is desirable to provide other modes of operation, such as, for example, complete sets of combinational logic functions. Perhaps the most basic of digital logic functions is "state inversion" (signal complementing) and "bit regeneration." Given these two basic functions, it is known that all other combinational logic functions, e.g., AND, OR, NAND, NOR, fan-in and fan-out, can be derived therefrom.

SUMMARY OF THE INVENTION

It is an object of this invention to provide means for controlled charge regeneration in charge transfer devices.

It is a further object of this invention to provide means for performing digital logic functions in charge transfer devices.

To these and other ends this invention includes detection means disposed within a charge transfer device for detecting the amount of charge thereexisting at a given time; means for disposing of the charge after detection; means for injecting a fresh supply of charge at another location within the material; and gating means coupled to the detection means for controlling the transfer of a desired amount of charge away from the injecting means in response to a signal from the detection means.

Given this combination of means, charge regeneration, and, accordingly, signal regeneration, is readily accomplished. State inversion is accomplished in accordance with another feature of this invention by adapting a threshold gating means such that the amount of charge transferred away from the generation means varies inversely with the amount of detected charge.

In one embodiment a pair of electrically floating MIS-type electrodes are conductively connected together, one of them providing the sensing function and the other providing the gating function.

In another embodiment an electrically floating localized semiconductive zone disposed within a charge transfer device provides the sensing function. The induced voltage on this floating zone is coupled to an associated MIS-type electrode which provides the gating function.

In both embodiments a reverse-biased rectifying barrier can be used as a collector for disposing of the charge carriers after detection. The fresh supply of charge can be provided in a variety of ways, one suitable way being to draw them from a localized semiconductive zone of the appropriate type semiconductivity or from a suitably injecting contact.

In other described embodiments logical "FAN-OUT" is accomplished by connecting one sensing means to each of a plurality of gating means which control the transfer of charge away from one or a plurality of generation means.

Logical NOR is provided by having a separate sensing means disposed in each of a plurality of separate charge transfer device channels of information and having the sensing means coupled separately to a corresponding plurality of gating means disposed serially with respect to an injecting means. The gating means are arranged so that charge is allowed to transfer away from the injecting means only if less than a predetermined amount of charge exists simultaneously at each of the sensed locations along the plurality of channels.

Logical NAND is provided by having a separate sensing means disposed in each of a plurality of separate charge transfer device channels of information and having the sensing means coupled separately to a corresponding plurality of gating means disposed in parallel with respect to an injecting means. The gating means are arranged so that charge is prevented from transferring away from the injecting means only if greater than a predetermined amount of charge exists simultaneously at each of the sensed locations along the plurality of channels.

Other logic functions will not be described in detail; but it will be appreciated by those in the art that the entire gamut of all other logic functions can be straightforwardly derived by combining those described above or by similarly constructing a single functional device in the same spirit as above.

BRIEF DESCRIPTION OF THE DRAWING

The aforementioned and other embodiments and the invention in general will be better understood from the following more detailed description taken in conjunction with the accompanying drawing in which:

FIG. 1 is an isometric cross-sectional view of a basic charge coupled device structure adapted primarily for three-phase operation;

FIGS. 2A–2C are somewhat schematic cross-sections of a linear arrangement of devices of the type shown in FIG. 1;

FIG. 3 is a cross-sectional view of a basic charge coupled device adapted for two-phase operation;

It will be appreciated that for simplicity and clarity of explanation the figures have not necessarily been drawn to scale. Reference numerals have been repeated from figure to figure to indicate corresponding elements where appropriate.

DETAILED DESCRIPTION

Figure 4:
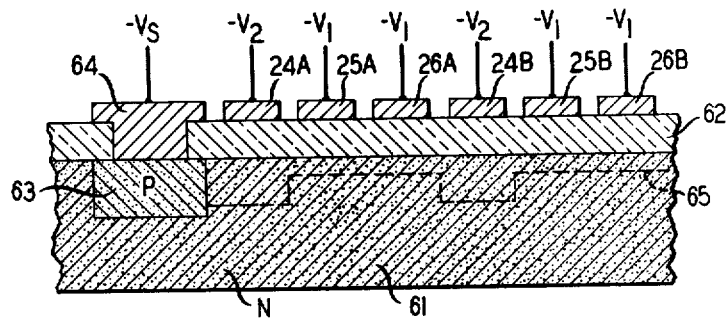
FIG. 4 is a cross-sectional view of apparatus for introducing a controlled amount of charge into a charge coupled device channel.

With more specific reference now to the drawing, it is believed the present invention will be more readily understood by first reviewing representative structures and modes of operation of the "charge coupled" type of apparatus described in the above-referenced copending Boyle et al and Kahng et al disclosures. FIGS. 1–3 are directed to this end. Further, to the extent that the disclosures in the above-referenced applications supplement the following disclosure, they are intended as incorporated herein by reference.

In charge coupled devices (CCD's), digital information is represented by the presence or absence of a packet of charge carriers localized in and electrostatically "coupled" to artificially induced potential energy minima, e.g., potential wells, often adjacent a surface of a suitable storage medium. Advantageously the potential wells are formed and controlled by application of voltages to field plate electrodes of the type conventionally used in the metal-insulator-semiconductor (MIS) technologies. Inasmuch as the MIS art is well established and well known, it is considered unnecessary to describe in detail procedures for fabricating the structures disclosed below.

FIG. 1 shows an isometric cross-sectional view of a basic charge coupled device structure 20 adapted primarily for three-phase operation. Device 20 includes a semiconductive N-type bulk portion 21 overlying which there is a relatively thin insulating layer 22. Overlying layer 22 are a plurality of close-spaced serially-disposed electrodes 24–26 connected by overlay contacts to sources of potential $(-V_1)$, $(-V_2)$, and $(-V_3)$, respectively. The $V_i$'s will be taken as positive numbers; and $V_3$ is greater than $V_2$ which, in turn, is greater than $V_1$. $V_1$ is greater than $V_T$ where $V_T$ is the threshold voltage for producing an inversion of the semiconductor surface under steady state conditions.

Broken line 27 represents schematically the surface potential (depth of the potential wells) adjacent the surface. Where, as here, the operating medium is semiconductive, broken line 27 may also be considered as representing schematically the boundaries of depletion regions formed by voltages applied to the electrodes.

Charge carriers, holes in this case, are represented schematically by plus signs inserted in the potential wells. Inasmuch as holes tend toward points of most negative potential, it is readily seen that holes stored under electrode 25 in FIG. 1 will transfer into the potential well under electrode 26 until all the holes have been transferred or until sufficient holes have transferred that the surface potentials under electrodes 25 and 26 have become equal, whichever occurs first. In operation, of course, ideally all would be transferred to avoid loss of signal information but this, in fact, is not normally realized.

Turning now to FIGS. 2A–2C, there is shown somewhat schematically in cross-section a linear array of devices of the type shown in FIG. 1. Every third electrode is connected to a common one of three clock line conduction paths 41–43. Because the electrodes function in triplets they are all given reference numerals 24–26 with successive alphabetic suffixes A, B, C, etc.

FIG. 2A represents an initial condition with $(-V_2)$ applied to the electrodes numbered 24 and $(-V_1)$ applied to the other electrodes, 25 and 26. In this figure and in the other figures to be described below, the semiconductive portion is assumed to be held at zero potential. For the purpose of discussion, it is presumed that approximately equal amounts of positive charge (holes) exist under electrodes 24A and 24C and none under electrode 24B. This, of course, may be thought of as a logical "one" stored under electrodes 24A and 24C and as a logical "zero" stored under electrode 24B.

FIG. 2B shows the state of the structure of FIG. 2A after the voltage on clock line 42 has been changed to $(-V_3)$. Because $V_3 > V_2 > V_1$ the charge (or absence of charge) previously under electrodes 24A, 24B, and 24C has transferred to the right into the deeper potential wells now under electrodes 25A, 25B, and 25C. FIG. 2C shows the same structure again in a resting or holding state, i.e., with $(-V_1)$ applied to clock lines 41 and 43 and $(-V_2)$ applied to clock line 42, a condition adapted to retain the logical states under electrodes 25A, 25B, and 25C. The cycle is then in the condition shown in FIG. 2A and is ready to be repeated so as to move the logic states under electrodes 26A, 26B, 26C, etc.

In CCD structures of the type shown in FIGS. 1 and 2A–2C in which the electrodes are at all points equidistant from a relatively uniformly doped semiconductor surface, symmetrical potential wells tend to form under each electrode. Because of this, three-phase operation of the electrodes in triplets is advantageous to provide asymmetry to the potential wells and thus to ensure unidirectionality of charge transfer. This is described in greater detail in the above-referenced Boyle-Smith and Kahng-Nicollian disclosures.

Such is not the case in CCD structures of the type shown in FIG. 3 where each electrode 53 and 54 is formed over an insulator 52 of nonuniform thickness over a semiconductive portion 51. In FIG. 3 every second electrode is connected to a common one of two clock lines 55 and 56 which, in turn, are driven by a two-phase clock which alternately applies $(-V_1)$ and $(-V_2)$ to the clock lines. Note that the potential wells in FIG. 3 are inherently asymmetrical and that each time the clock line voltages are changed the stored logical state is transferred one step (one electrode) to the right in FIG. 3. All this is described in more detail in the above-referenced copending Kahng-Nicollian application.

Regardless of whether the CCD is adapted for two-phase, three-phase, or four-phase operation (disclosed in the copending U.S. application Ser. No. 85,026, U.S. Pat. No. 3,921,195 filed Oct. 29, 1970, by G. E. Smith and R. J. Strain), the problem still remains that normally a small fraction of the charge to be transferred is left behind each time a packet is transferred from one potential well to the next. To compensate for this problem and to provide combinational logic functions in CCD's, some form of controlled charge regeneration is advantageous. As part of the solution, FIG. 4 represents a convenient means for introducing a controlled amount of charge into a CCD information channel.

In FIG. 4, electrodes 24A–26B represent a linear array of CCD electrodes spaced from the surface of an N-type semiconductive portion 61 by an insulating layer 62. Semiconductor 61 includes a P-type localized zone 63 to which a reverse-bias $(-V_S)$ is applied through an electrode 64. Broken line 65 represents schematically the depth of the potential wells under the electrodes 24A–26B, the surface potential under electrodes 24A and 24B being more negative than under the others. If $(-V_S)$ is more negative than the surface potential under electrode 24A, no holes will flow from zone 63 into the CCD channel. If $(-V_S)$ is less negative than the surface potential under electrode 25A, holes will flood into the channel filling up the potential wells until the surface potential along the entire channel has risen to about $(-V_S)$.

However, if $(-V_S)$ is more negative than the surface potential under electrode 25A but less negative than the surface potential under electrodes 24A, then holes will flow from zone 63 into the CCD channel and only partially fill the potential well under electrode 24A. Once sufficient holes have accumulated in the potential well under electrode 24A that the surface potential there is about equal to $(-V_S)$, then holes stop flowing into the CCD channel.

Thus, by adjusting $V_S$ in relation to the $V_i$'s applied to the CCD electrodes, a controlled amount of charge can be selectively injected or not injected to generate a digital bit stream flowing in a new CCD channel to the right in FIG. 4. It will be appreciated that zone 63 is adapted to operate in similar fashion as the source in an insulated gate field effect transistor (IGFET).

Figure 5:
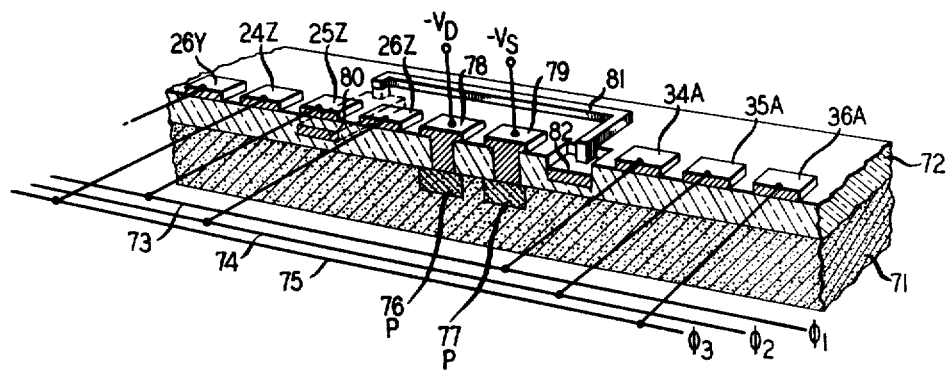
FIGS. 5 and 6 are isometric cross-sectional views of basic inversion-regeneration elements in accordance with our invention.
Figure 6:
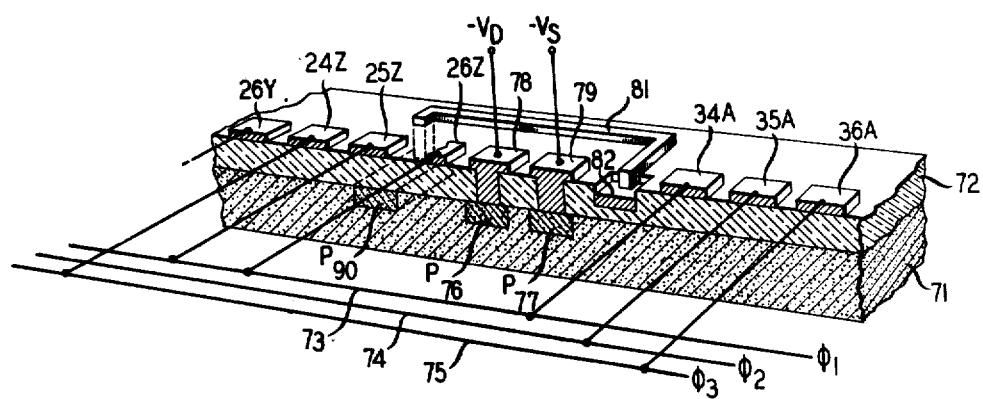

If now a bit generator such as shown in FIG. 4 is combined with and coupled to a detector which senses the bits being transferred in a CCD channel, the bit generator can be made to regenerate into a new channel the information being transferred in the degraded channel in response to signals from the detector. FIGS. 5 and 6 illustrate two embodiments of such bit regenerators in isometric cross-section.

The structure in FIG. 5 includes an N-type semiconductive bulk portion 71 and an overlying insulating layer 72. Serially disposed field plate electrodes 26Y, 24Z, 25Z, and 26Z represent the end of a CCD channel whose bit stream is to be regenerated. Serially disposed field plate electrodes 34A, 35A, and 36A represent the beginning of a fresh CCD channel to accept the regenerated bit stream. As in FIGS. 1 and 2A–2C, every third CCD electrode is connected to a common one of three clock lines 73–75.

A pair of P-type localized zones 76 and 77 are disposed adjacent the surface of semiconductor 71 and are conductively connected through electrodes 78 and 79 to sources of negative potential $(-V_D)$ and $(-V_S)$, respectively. P-type zone 76 is disposed adjacent the last electrode 26Z in the degraded channel; and, advantageously, $(-V_D)$ is selected to maintain P-type zone 76 more negative than the most negative surface potential induced under CCD electrode 26Z so that as each bit is transferred under electrode 26Z it is collected and destroyed, i.e., conducted to ground. It will be appreciated that zone 76 is thus adapted to operate in similar fashion as the drain in an IGFET.

P-type zone 77 is adapted to operate as a bit generator; and, accordingly, $(-V_S)$ applied thereto advantageously is selected to maintain zone 77 sufficiently negative that only enough holes are drawn selectively therefrom to partially fill the potential wells under electrode 34A without flooding the new CCD channel.

Disposed under CCD electrode 25Z is an electrically floating sensor electrode 80 which is spaced from electrode 25Z and from the semiconductor 71 by portions of insulating layer 72. Sensor electrode 80 is connected by an overlay contact 81 to a gating electrode 82 disposed between the bit generator 77 and the first CCD electrode 34A.

The capacitance between electrodes 25Z and 80 is defined to be $C_1$; and the capacitance between electrode 80 and semiconductor 71 is defined to be $C_2$. The capacitance associated with the depletion region formed under electrodes 25Z and 80 is assumed small with respect to $C_1$ and $C_2$. With these definitions, then, the voltage induced on electrode 80 is approximately the applied clock pulse voltage $(\Phi_1)$ if the potential well thereunder is empty (logical "zero" bit). Conversely, if the potential well is nearly full of charge (logical "one" bit) the voltage induced on electrode 80 is approximately $\Phi_1$ multiplied by the ratio $C_1/(C_1+C_2)$. Remembering that $\Phi_1$ is a negative voltage and $C_1$ and $C_2$ are positive numbers, it is seen that a more negative voltage is induced on electrode 80 if a "zero" is under electrode 25Z than if a "one" is there.

Note that these induced voltages on electrode 80 are coupled directly to and appear upon gating electrode 82, disposed between bit generator 77 and CCD electrode 34A. Note also that the first CCD electrode 34A is connected to the same clock line as is electrode 25Z under which the bits are being sensed. Because of this, a packet of holes (logical "one" bit) is transferred from bit generator 77 to the potential well under electrode 34A if a "zero" is at that time under electrode 25Z. Conversely, the capacitance ratio $C_1/(C_1+C_2)$ and the spacing of electrode 82 from the semiconductor surface are adjusted such that no holes (logical "zero" bit) are transferred from bit generator 77 if a "one" is at that time under electrode 25Z. This is accomplished, of course, by adjusting the capacitance ratio and the spacing of electrode 82 such that if a "one" is under electrode 25Z, the surface potential under electrode 82 is less negative than $(-V_S)$.

In some uses, it may be desirable to establish a DC bias on gating electrode 82 for optimum operation. This is readily accomplished by additionally connecting gating electrode 82 through a high impedance (not shown) to a DC voltage source. In this case the time constant associated with the high impedance advantageously is significantly greater than the inverse of the bit transfer rate through the CCD channel so that the pulse voltages induced on sensor electrode 80 can cause gating electrode 82 to vary in response thereto without interference from the DC bias. It will be appreciated that electrodes 80 and 82 thus may still be thought of as "electrically floating" with respect to AC and pulsed signals.

With reference now to FIG. 6 there is represented another state inverter and bit generator embodiment like that of FIG. 5 except that the sensing function is performed by an electrically floating P-type localized zone 90 disposed adjacent the semiconductor surface under CCD electrode 25Z. The only difference between FIGS. 5 and 6 is that electrically floating sensor electrode 80 has been removed and replaced by an electrical floating localized zone 90 in FIG. 6. Because of the abundant similarities the same reference numerals have been repeated in FIG. 6 where appropriate.

In similar fashion to that described with reference to FIG. 5, voltages are induced on sensor zone 90 in FIG. 6 and are coupled directly to gating electrode 82 which inhibits or allows the transfer of a quantity of charge from bit generator 77. The voltage on zone 90 at any instant is approximately equal to the surface potential induced thereon. This surface potential is approximately equal to $\Phi_1$ if a "zero" transfers under electrode 25Z as $\Phi_1$ is applied thereto and is something less negative than $\Phi_1$ if a "one" (packet of holes) transfers in. If as $\Phi_1$ is applied a sufficient number of holes flow in to fill the potential well, the surface potential will rise to some maximum value less than zero. In typical structures the voltage induced on zone 90 when a "one" is present can be readily made to be less than one-third as negative as the voltage induced when a "zero" is present; and this difference is sufficient to cause the desired gating action at electrode 82. Note that as with the structure of FIG. 5, a "one" is gated away from bit generator 77 in FIG. 6 if a "zero" is under electrode 25Z and a "zero" is gated away if a "one" is under electrode 25Z.

Having described the structure and operation of the basic inversion-regeneration elements in accordance with this invention there will now be described, with reference to FIGS. 7-14, a plurality of advantageous and suggestive modifications and uses for such elements further in accordance with other aspects of this invention. Without sacrificing completeness, FIGS. 7-14 are shown as somewhat schematic plan views of CCD structures of the type shown in FIGS. 1-6. In FIGS. 7-14, solid line patterns depict field plate electrodes disposed over an insulating layer; and broken line patterns depict either electrodes disposed within the insulator (such as electrode 80 in FIG. 5) or localized zones in the semiconductor (such as zones 76, 77, and 90 in FIGS. 5 and 6). This mode of illustration is adopted primarily for simplicity, generality, and economy of illustration, all of which will become more clearly understood as the description proceeds.

Figure 7:
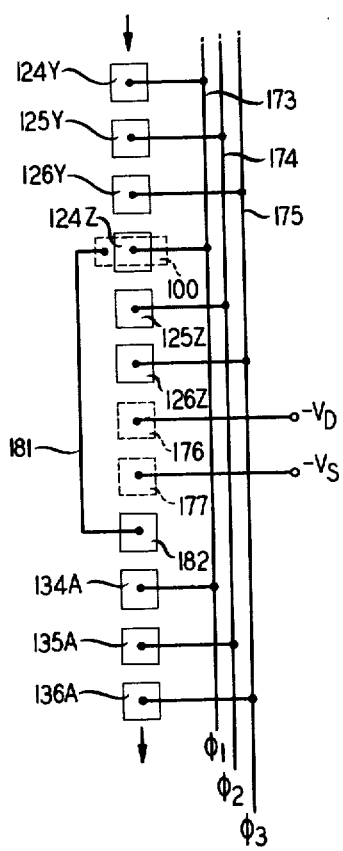
FIGS. 7–10 are schematic plan views of other inversion-regeneration embodiments in accordance with our invention.

With more specific reference now to FIG. 7, there is shown a schematic plan view of an inversion-regeneration element similar to those shown in FIGS. 5 and 6. In FIG. 7 features 124Y-126Z represent field plate electrodes at the end of a CCD channel whose information is to be inverted and regenerated; and features 134A-136A represent field plate electrodes at the beginning of a fresh CCD channel to accept the newly-regenerated bit stream. It will be appreciated that electrodes 124Y-126Z and 134A-136A are analogous to the electrodes 26Y-26Z and 34A-36A, respectively, of FIGS. 5 and 6. As in the previously described FIGS. 1, 2A-2C, 5, and 6, every third CCD electrode is connected to a common one of three clock lines 173-175, to which clock voltages $\Phi_1$-$\Phi_3$ (alternately ($-V_1$), ($-V_3$), and ($-V_2$)) are applied.

In FIG. 7 broken-line feature 100, disposed under CCD electrode 124Z, is a sensor electrode similar to either electrode 80 in FIG. 5 or electrode 90 in FIG. 6. As in FIGS. 5 and 6, the sensor electrode 100 is not connected to the clock lines but is coupled by a conductor 181 to a gating electrode 182 which operates as does gating electrode 82 in FIGS. 5 and 6.

Broken-line feature 176 represents a P-type localized zone connected to a source of negative voltage ($-V_D$) and adapted to operate as a drain, analogous to zone 76 in FIGS. 5 and 6. Broken-line feature 177 represents a P-type localized zone connected to a source of negative voltage ($-V_S$) and adapted to operate as a bit generator, analogous to zone 77 in FIGS. 5 and 6.

Unlike the apparatus depicted in FIGS. 5 and 6, sensor element 100 in FIG. 7 is disposed under field plate electrode 124Z and is separated from drain 176 by a pair of field plate electrodes 125Z and 126Z, instead of only one. This separation by two electrodes rather than one is not necessary for operability but is advantageous to more effectively decouple and isolate sensor element 100 from the effects of drain 176.

Referring back now to FIGS. 1 and 2A-2C, it will be observed that the packets of charge representing information are located only under the electrodes to which ($-V_3$), the most negative clock voltage, is applied. The other two electrodes of each triplet serve to separate each charge packet from the adjacent packets. Thus, in FIG. 7, it is desired to transfer a packet of charge away from bit generator 177 only when ($-V_3$) is applied to electrode 124Z (overlying sensor 100) because only then is there a packet of charge (or the absence thereof) representing information to be sensed under electrode 124Z. As a result of this reasoning, the general principle obtains that the field plate electrode (124Z in FIG. 7) overlying the sensor (100 in FIG. 7) will always be connected to the same clock line (173 in FIG. 7) as is the first field plate electrode (134A in FIG. 7) following the gating electrode (182 in FIG. 7) so that information simultaneously is sensed, inverted, regenerated, and transferred to the first field plate (134A in FIG. 7) of the new CCD channel. Also as a result of the above reasoning, it will be appreciated that $V_S$ should be greater than $V_1$ and $V_2$ but less than $V_3$ so that gating electrode 182 will allow charge to be transferred away from bit generator 177 only when simultaneously ($-V_3$) is appplied to electrode 124Z and a "zero" is under electrode 124Z.

Figure 8:
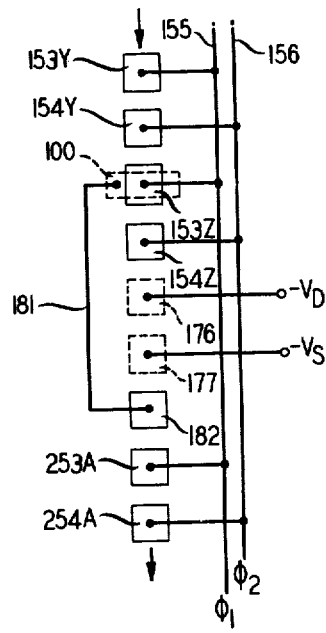

With reference now to FIG. 8, there is shown a schematic plan view of an inversion-regeneration element similar to those shown in FIGS. 5 and 6. However, the apparatus of FIG. 8 is adapted for two-phase operation. To this end, field plate electrodes 153Y-154Z represent the end of a CCD channel whose information is to be inverted and regenerated; and field plate electrodes 253A-254A represent the beginning of a new CCD channel to accept the newly-regenerated bit stream. To ensure unidirectionality of charge transfer, these field plate electrodes advantageously are of the type adapted to produce asymmetrical potential wells, as described with reference to FIG. 3.

In FIG. 8 every second one of the field plate electrodes is coupled to a common one of two clock lines 155 and 156. Features 176 and 177 represent a drain and a bit generator, respectively, and as such are coupled to appropriate sources of voltage $(-V_D)$ and $(-V_S)$. A sensing element 100, like either electrode 80 in FIG. 5 or electrode 90 in FIG. 6, is disposed under field plate 153Z and is coupled by a conductor 181 to a gating electrode 182. Where, as here, field plate electrodes of the type shown in FIG. 3 are used, sensor 100 advantageously is disposed only under that part of the appropriate field plate electrode (153Z in FIG. 8) which overlies the thinner dielectric because that is where the charge packet is localized, as shown in FIG. 3. In this manner a maximum of induced voltage and a minimum amount of parasitic capacitance are realized. Operation of the apparatus of FIG. 8 will be apparent from the foregoing discussion.

Figure 9:
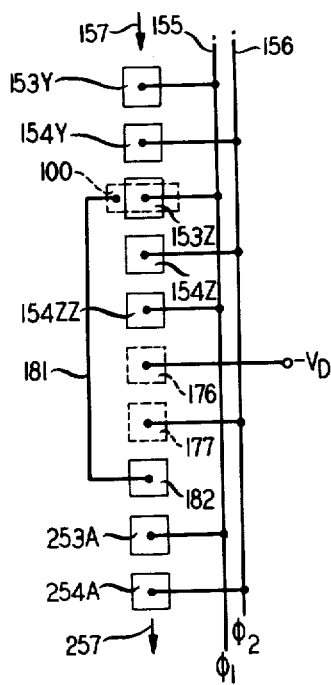

FIG. 9 illustrates a schematic plan view of another inversion-regeneration element adapted for two-phase operation. The apparatus illustrated in FIG. 9 differs from that of FIG. 8 only in that bit generator 177 is coupled to and therefore driven by clock line 156, and sensor element 100 is separated from drain 176 by a pair of field plate electrodes 154Z and 154ZZ, rather than just one.

As with the above-described three-phase embodiments, the field plate electrode (153Z in FIG. 9) under which sensor 100 is disposed must be connected to the same clock line (155 in FIG. 9) as is the first field plate electrode (253A in FIG. 9) following the gating electrode (182). If, as in FIG. 9, the bit generator is to be driven by a clock line to reduce the number of different conduction paths required, the bit generator (177) must be connected to a different clock line (156 in FIG. 9) than are electrodes 153Z and 253A so as to achieve the appropriate voltage relationships. This will be better understood from the following detailed description of a complete cycle of operation of the apparatus depicted in FIG. 9.

First, assume one half-cycle in which $\Phi_1=(-V_1)$ is applied to clock line 155 and $\Phi_2=(-V_2)$ is applied to clock line 156, where $V_2>V_1$. During this half-cycle the bit to be inverted and regenerated is stored under electrode 154Y. Another bit which has been inverted and regenerated is stored in duplicate, the degraded bit under electrode 154Z and the inverted and regenerated bit under electrode 254A. In this condition no packet of positive charge can be transferred from bit generator 177 to field plate electrode 253A regardless of the voltage on gating electrode 182 because the bit generator is more negative $(-V_2)$ than electrode 253A.

Now, assume that the clock switches polarity to the other half-cycle in which $\Phi_1$ becomes $(-V_2)$ and $\Phi_2$ becomes $(-V_1)$. As the voltages are changed, each charge packet moves one step (one electrode) down in FIG. 9 are indicated by arrows 157 and 257 in the manner described with reference to FIG. 3. The degraded bit under electrode 154Z is transferred to electrode 154ZZ and is swept into drain 176 by $(-V_D)$ which is more negative than $(-V_2)$; and the inverted replica of this bit is transferred from electrode 254A to the next electrode (not shown) in the regenerated channel. Note that electrode 253A is now more negative $(-V_2)$ than bit generator 177 $(-V_1)$ so that a packet of positive charge will be transferred to electrode 253A if allowed by gating electrode 182.

As the clock voltages are changed to this second condition, the incoming bit moves from electrode 154Y to electrode 153Z where it is detected by sensor 100. As described with reference to FIGS. 5 and 6, sensor 100 and gating electrode 182 are adapted such that a packet of charge ("one") is allowed to transfer from bit generator 177 to electrode 253A if the absence of a packet of charge ("zero") is detected by sensor 100; and no charge ("zero") is permitted to transfer if a "one" is detected by sensor 100.

In summary, no bit is allowed to transfer to electrode 253A during the first half-cycle because of the voltage relationship between bit generator 177 and electrode 253A; and during the other half-cycle the voltage relationship between generator 177 and electrode 253A is reversed such that a "one" is prevented from transferring therebetween only if a "zero" is at the sensor.

It will be appreciated that the apparatus of FIG. 8 also could be operated with bit generator 177 driven by clock line 156. The three-phase apparatus of FIG. 7 also could be operated with bit generator 177 driven by clock line 175 provided the clock pulse is suitably shaped, e.g., sine waves, so that the appropriate voltage relationships are maintained between bit generator 177, gating electrode 182, and field plate electrode 134A.

Figure 10:
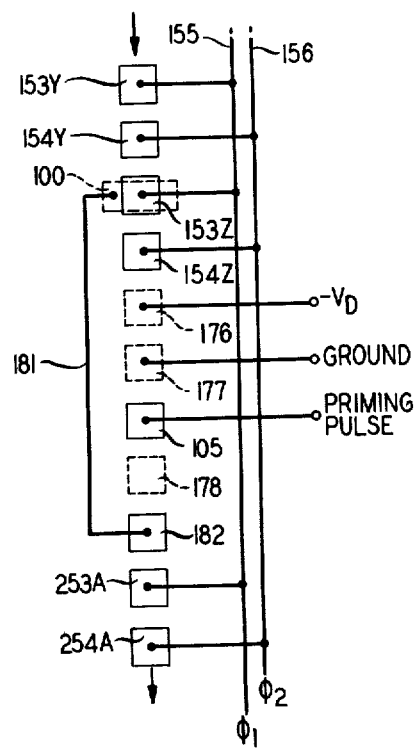

With reference now to FIG. 10 there is shown a a schematic plan view of still another inverter-regenerator in accordance with our invention and adapted for two-phase operation. The apparatus is similar to that shown in FIG. 8 except in the means for generating bits; and, accordingly, the description of FIG. 10 will be abbreviated and directed primarily to the different features. As in FIG. 8, the apparatus includes a P-type localized drain 176 connected to a suitably negative source of potential $(-V_D)$ and a P-type localized zone 177 for providing a source of positive charge carriers. Unlike in FIG. 8, however, source 177 in FIG. 10 is connected to electrical ground and is spaced from gating electrode 182 by a field plate electrode 105 and an electrically floating P-type localized zone 178.

In operation, negative voltages applied to field plate electrode 253A and negative voltages induced on gating electrode 182 cause charge to be transferred away from zone 178 to field plate 253A which, in turn, causes a negative potential to be induced on zone 178. Then, with zone 178 negative and zone 177 at ground, and after gating electrode 182 has been turned off, a negative "priming pulse" applied to electrode 105 for a given time allows a relatively precisely determinable amount of charge to transfer from zone 177 to zone 178.

This is termed "priming" because it enables the preliminary storage in zone 178 of a relatively precise amount of charge which can then be gated as a "one" to electrode 253A. This availability of a precisely predictable amount of charge is desirable because the noise margin of a system is dependent on, among other things, the degree by which each "one" bit is like the other "one" bits and by which each "zero" is like the other "zeros".

Figure 11:
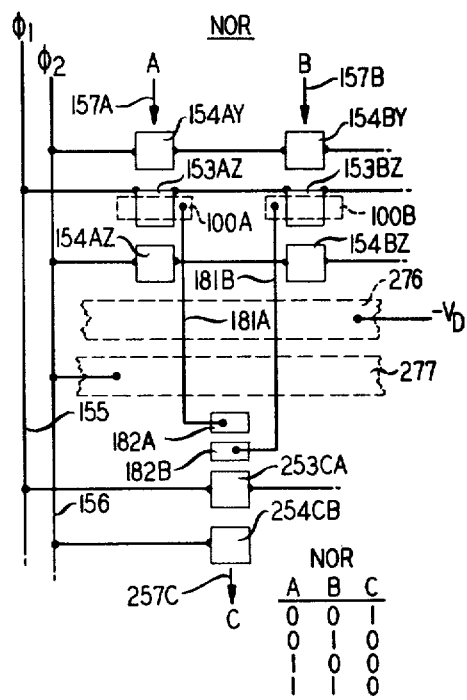
FIGS. 11–14 are schematic plan views of charge coupled logic apparatus employing inversion-regeneration elements in accordance with our invention.
Figure 12:
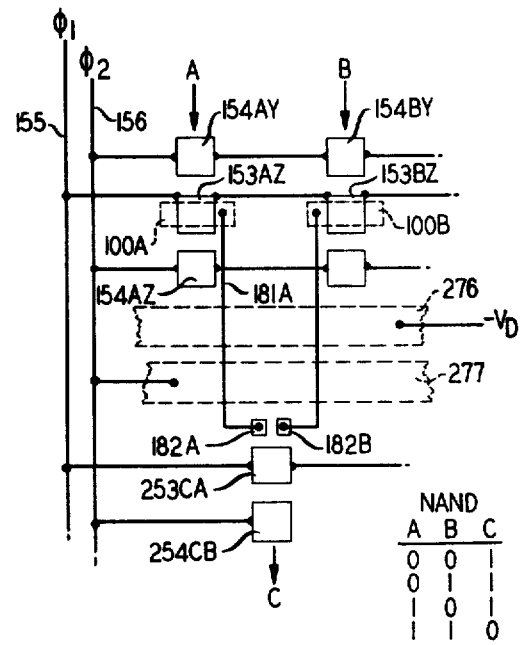
Figure 13:
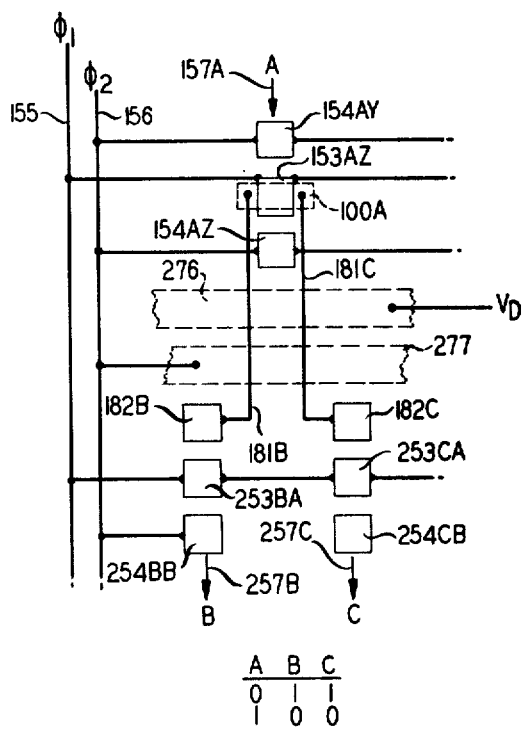

Turning now to FIGS. 11-13, there are shown a plurality of exemplary embodiments employing inverter-regenerators of any of the types described hereinabove and being adapted for performing logic functions.

FIG. 11 shows a schematic plan view of apparatus adapted for performing a logical NOR operation, the truth table for which is shown in the lower right-hand corner of FIG. 11. The upper portion of the figure represents two CCD channels A and B coupled to a common pair of clock lines 155 and 156 and having information propagating downward, as indicated by arrows 157A and 157B. Electrodes 154AY, 153AZ, 154AZ, 154BY, 153BZ, and 154BZ are field plate electrodes in the respective channels, analogous to electrodes 154Y, 153Z, and 154Z in FIGS. 8–10. The lower portion of the figure, i.e., field plate electrodes 253CA and 253CB, represents the beginning of a new CCD channel, labeled C, to accept the regenerated bits resulting from the NOR operation. Broken line feature 276 represents a P-type localized zone connected to a source of negative voltage ($-V_D$) and adapted to operate as a drain, analogous to zones 76 and 176 in the preceding figures. Broken line feature 277 represents a P-type localized zone adapted to operate as a bit generator in the manner described with reference to zone 177 in FIG. 9 and as such is connected to one of the clock lines 156.

A pair of separate elements 100A and 100B are disposed under electrodes 153AZ and 153BZ in channels A and B. Each of the sensors is connected in the manner described with reference to the preceding figures by conductors 181A and 181B to separate ones of a pair of gating electrodes 182A and 182B. As shown, for a NOR element the gating electrodes are disposed in series with respect to bit generator 277 and with respect to the first CCD electrode 253CA of channel C.

In operation separate bit streams of information are transferred simultaneously along channels A and B in response to clock signals applied to clock lines 155 and 156. The bit streams are synchronized such that bits move under electrodes 153AZ and 153BZ simultaneously. If either sensor 100A or 100B detects a "one", there will be induced on the gating electrode to which that sensor is coupled a voltage sufficient to prohibit the transfer of charge thereunder. Thus, it will be seen that, in accordance with the truth table in FIG. 11, a "one" will be allowed to transfer from bit generator 277 to field plate electrode 253CA only if a "zero" exists at both sensors 100A and 100B.

At this point it should be appreciated that within the NOR element shown in FIG. 11, gating electrodes 182A and 182B perform a logical AND function, i.e., only if a potential well is induced under both of them can a packet of charge be transferred from bit generator 277 to field plate 253CA. This leads to the more general teaching that wherever an AND function is desired in a CCD system it can be accomplished in part by disposing a plurality of gating electrodes in series.

FIG. 12 shows a schematic plan view of apparatus adapted for performing a logical NAND operation, the truth table for which is shown in the lower right-hand corner of FIG. 12. The apparatus of FIG. 12 differs from that shown in FIG. 11 only in that gating electrodes 182A and 182B are disposed in parallel with respect to bit generator 277 and CCD electrode 253CA. With this disposition of the gating means charge is prevented from transferring away from bit generator 277 only if a "one" is present at both sensors 100A and 100B. This, of course, is consonant with the NAND truth table in FIG. 12.

At this point it should be appreciated that within the NAND element shown in FIG. 12, gating electrodes 182A and 182B perform a logical OR function, i.e., if a potential well is induced under either of them a packet of charge can be transferred from bit generator 277 to field plate 253CA. This leads to the more general teaching that whenever an OR function is desired in a CCD system it can be accomplished in part by disposing a plurality of gating electrodes in parallel.

FIG. 13 shows a schematic plan view of apparatus adapted for performing a logical "FAN-OUT" operation, the truth table for which is shown in the lower right-hand corner of FIG. 13. The upper portion of the figure represents a CCD channel, labeled A, coupled to a pair of clock lines 155 and 156 and having information propagating downward, as indicated by arrow 157A. Electrodes 154AY, 153AZ, and 154AZ are field plate electrodes of channel A, analogous to electrodes 154Y, 153Z, and 154Z in FIGS. 8–10. The lower portion of the figure, i.e., field plate electrodes 253BA, 254BB, 253CA, and 254CB, represents the beginning of a pair of CCD channels, labeled B and C, to accept the regenerated bits resulting from the "FAN-OUT" operation. Broken line features 276 and 277 represent a drain and a bit generator, respectively, adapted to operate as described with reference to FIGS. 11 and 12.

A sensor 100A is disposed under electrode 153AZ and is coupled by conductors 181B and 181C to a pair of gating electrodes 182B and 182C. From the description hereinabove, it will be appreciated that whenever a "zero" is present at sensor 100A a "one" will be gated by electrode 182B from bit generator 277 into channel B and another "one" will be gated into channel C. Conversely, when a "one" is present at sensor 100A, "zeros" will be gated into channels B and C.

Of course, "FAN-OUT" can also be accomplished in a variety of other ways besides the one shown in FIG. 13. In many applications, for example, it may be advantageous to connect the sensor to a single gating electrode and to merge field plate electrodes 253BA and 253CA (FIG. 13) into one larger electrode so as to minimize parasitic capacitive loading on the sensor.

Although our invention has been described in part by making detailed reference to certain specific embodiments, such detail is intended to be and will be understood to be instructive rather than restrictive. It will be appreciated by those in the art that many variations may be made in the structure and modes of operation without departing from the spirit and scope of our invention as disclosed in the teachings contained herein.

For example, throughout the disclosure the semiconductivity types may be reversed as desired, provided a corresponding reversal of voltage polarities also is made.

Still further, of course, the apparatus shown in FIGS. 11 and 12 is not limited to sensing only a pair of incoming channels but may have an even greater plurality of incoming channels, provided a sensor is disposed in each one and each sensor is coupled to a separate serially disposed or parallel disposed gating electrode, depending upon the logical operation desired. And, of course, a "FAN-OUT" such as shown in FIG. 13 is not limited to two output channels but may be extended to an even greater plurality.

Figure 14:
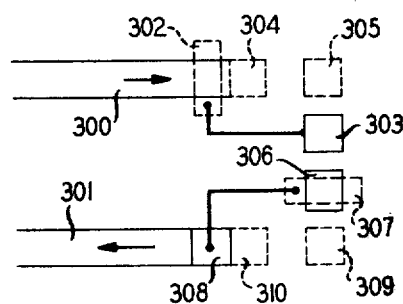

Still further, it will be appreciated that a pair of inverter-regenerators as described herein may be connected in tandem such that the regenerated pulse is inverted twice and therefore restored to a regenerated replica. An example of where such an arrangement might find use is shown schematically in FIG. 14. In FIG. 14, features 300 and 301 represent serpentine CCD channels, the flow of information in which is represented by the arrows. In channel 300 a sensor 302 (of either type described in FIGS. 5 and 6) detects incoming degraded signals and induces a corresponding voltage on a gating electrode 303. After the incoming signals are sensed, they are collected in the manner described hereinabove by a drain such as feature 76 in FIGS. 5-6 represented by the square broken-line feature 304. Another square broken line feature 305 represents a source or bit generator such as feature 77 in FIGS. 5-6. Thus, the combination of features 302, 303, 304, and 305 represents an inversion-regeneration element.

Bits from source 305 are gated by electrode 303 to another field plate electrode 306. Another sensor 307 is connected to a field electrode 308 disposed at the beginning of channel 301. After the bits from source 305 have been detected by sensor 307, they are collected by a second drain 309. A second source represented by broken line feature 310 serves as a bit generator, the bits from which are gated by electrode 308 into channel 301. Although this double inversion is seldom, if ever, necessary, it may be desirable in relatively short serpentine data patterns, if the system designer would rather perform double inversion than account for single state inversion.

Still further, of course, it will be appreciated that inasmuch as NAND and NOR each constitutes a logically independent set, all other logic functions can be readily derived from conbinations of either one in accordance with principles well known in the logic arts.

Still further, of course, it will be appreciated that bit generators, sensors, and inversion-regeneration elements can readily be combined within the spirit and scope of the teachings herein in numerous ways to provide other basic logic functions not expressly discussed herein.

Still further, of course, it will be appreciated that the aforedescribed inversion-regeneration elements and the many and diverse embodiments thereof can be readily adapted for use in charge transfer devices of the bucket-brigade type disclosed in the application of Berglund and Boll, referred to hereinabove. A basic form of such an adaptation is shown in FIG. 15 and will now be described with reference thereto.

Figure 15:
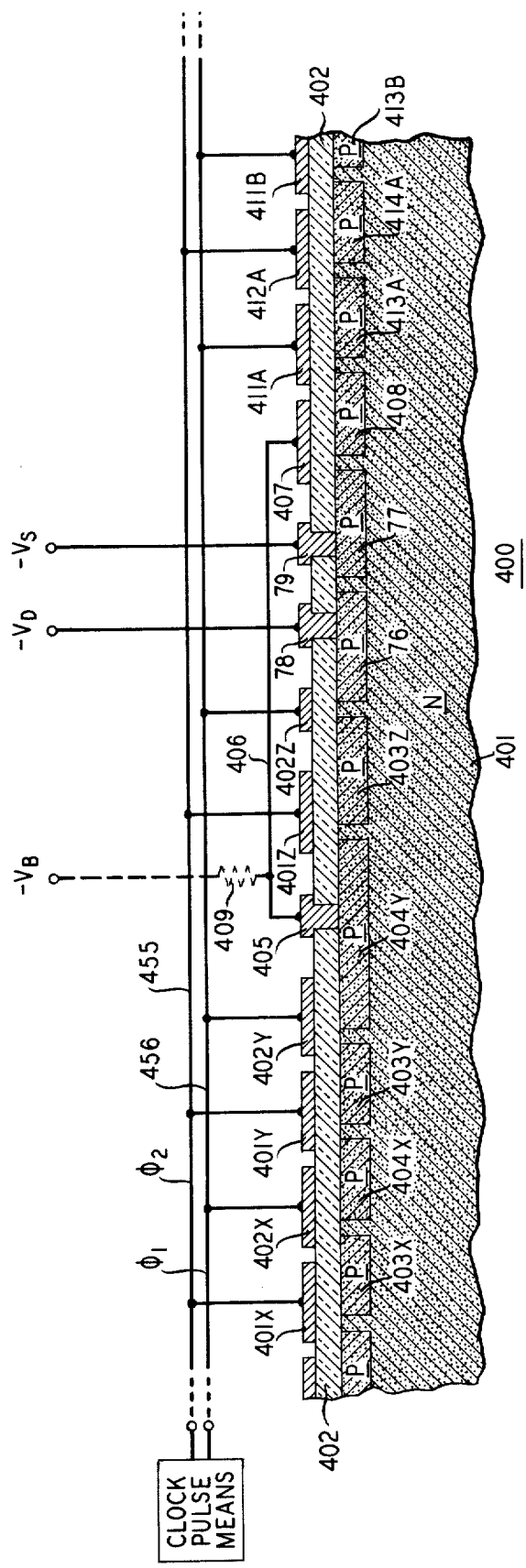
FIG. 15 is a schematic cross-sectional view of bucket-brigade apparatus employing a basic inversion-regeneration element in accordance with another embodiment of our invention.

In FIG. 15 there is shown a somewhat schematic cross-sectional view of a portion 400 of bucket-brigade type of charge transfer apparatus employing a basic inversion-regeneration element in accordance with another embodiment of our invention. Element 400 includes a semiconductive bulk portion 401, shown here illustratively as N-type, and a plurality of P-type surface zones. A dielectric layer 402 is disposed over the surface of semiconductor 401. Overlying dielectric layer 402 are a plurality of serially disposed field plate electrodes 401X, 402X, 401Y, 402Y, 401Z, and 402Z which in combination with a corresponding plurality of asymmetrically disposed, underlying, P-type localized zones represented by broken-line patterns 403X, 404X, 403Y, 404Y, 403Z, and 76 represent the end of a bucket-brigade channel whose bit stream is to be inverted and regenerated. In like manner, serially disposed field plate electrodes 411A, 412A, and 411B which in combination with a plurality of asymmetrically disposed, underlying P-type localized zones represented by broken-line patterns 413A, 414A, and 413B represent the beginning of a fresh bucket-brigade channel to accept the inverted and regenerated bit stream. As shown, every second one of the aforementioned field plate electrodes is connected to a common one of a pair of clock lines 455 and 456.

As will be appreciated more fully from a careful reading of the aforementioned Berglund-Boll disclosure, the preferred direction for information advance is determined by the asymmetry with which each pair of underlying zones is overlapped by the field plate electrodes. More specifically, it should be noted in FIG. 15 that each of the aforementioned electrodes overlaps a portion of two separate underlying zones and that in the incoming channel whose bit stream is to be regenerated and in the outgoing channel which accepts the inverted and regenerated bit stream, the greater overlap is to the right. This asymmetry in overlap causes preferential direction of information advance because of the resulting asymmetry in capacitive coupling between the field plate electrodes and the underlying zones.

The reference numerals used in FIGS. 5 and 6 for the features included in the inversion-regeneration element have been repeated in FIG. 15, where appropriate. Accordingly, in FIG. 15, P-type zone 76 represents a drain zone for disposing of degraded bits after detection; and P-type zone 77 represents an independent source zone, i.e., a bit generator, from which injected mobile charge carriers are gated selectively to produce the regenerated bit stream. Note that, as in FIG. 6, drain and source zones 76 and 77 are conductively connected through electrodes 78 and 79, respectively, to sources of negative potential $(-V_D)$ and $(-V_S)$, respectively. As in the apparatus of FIGS. 5 and 6, $(-V_D)$ advantageously is selected to maintain P-type zone 76 more negative than the most negative surface potential induced on adjacent zone 403Z so that degraded bits can always transfer from zone 403Z into drain 76 and thus be collected and destroyed, i.e., conducted to ground. And, as in the previous description, $(-V_S)$ is selected to maintain bit generator zone 77 sufficiently negative that only enough holes are drawn selectively therefrom to partially fill the potential wells formed in zone 408 without flooding the new channel.

In operation, zone 404Y operates as a sensor zone; and voltages induced thereon are coupled directly through electrode 405 and conductor 406 to a gating electrode 407, disposed between bit generator 77 and zone 408. In similar fashion to that described with reference to FIG. 6, the voltage on zone 404Y at any instant is approximately equal to the surface potential induced thereon. This surface potential is approximately equal to the clock line voltage $(\phi_1)$ if a "zero" transfers into sensor zone 404Y as $\phi_1$ is applied to electrode 402Y and is something less negative than $\phi_1$ if a "one" (packet of holes) transfers in.

If as $\phi_1$ is applied a sufficient number of holes flow in to partially fill the potential well, the surface potential of zone 404Y will rise to some maximum value less than zero. As with the CCD embodiments of FIGS. 5 and 6, the voltage induced on sensor zone 404Y when a "one" is present readily can be made to be less than one-third as negative as the voltage induced when a "zero" is present; and this difference is sufficient to cause the desired gating action at electrode 407. Thus, clearly, in a fashion analogous with that of FIGS. 5 and 6, the parasitic capacitance and spacing of electrode 407 from the surface of semiconductor 401 can be adjusted such that a "one" is gated by electrode 407 from source 77 to zone 408 if a "zero" is in sensor zone 404Y; and a "zero" is gated by electrode 407 from source 77 to zone 408 if a "one" is in sensor zone 404Y.

As discussed hereinabove with reference to FIGS. 5 and 6, it may be desirable in some situations to establish a DC bias on the gating electrode (407 in FIG. 15) and/or on the sensor (404Y in FIG. 15) for optimum operation. This is readily accomplished by connecting conductor 406 through a high impedance to a DC voltage source. This is depicted schematically in FIG. 15 by phantom resistor 409 connected between conductor 406 and a DC bias source ($-V_B$). As with the CCD apparatus, the time constant associated with the high impedance (409) advantageously is significantly greater than the inverse of the bit transfer rate through the bucket-brigade channel so that the pulse voltages can cause gating electrode 407 to vary in response thereto without interference from the DC bias.

It will be appreciated that the bucket-brigade shift register and inversion-regeneration element shown in and described with reference to FIG. 15 may readily be adapted for all the many and diverse uses depicted in and suggested with respect to FIGS. 7-14 and the CCD embodiments discussed in greater detail hereinabove.

Further, it will be appreciated that suitably injecting Schottky-barrier diodes and/or other rectifying barrier means can be substituted for any or all of the zones in the above-described apparatus as an alternative means for providing the collecting and injecting functions requisite therein.

Still further, it will be appreciated that inversion-regeneration elements in accordance with our invention readily can be adapted for use in charge transfer device apparatus wherein the storage medium is other than semiconductive. Such charge transfer device apparatus is described, for example, in U.S. patent application Ser. No. 47,205, filed June 18, 1970, by D. Kahng now U.S. Pat. No. 3,700,932. In such apparatus the storage medium may, for example, be an insulator which is not characterized by any one particular conductivity type. In certain of these insulators, zones suitable for injection and collection of carriers can be formed. In others, suitable zones cannot readily be formed. In the latter case, the required injection and collection of carriers in accordance with this invention can be achieved by substituting injecting contacts, for example of the type described in the Kahng application, for the zones. These contacts, formed with the surface of the storage medium, may be substituted for the zones in the inversion-regeneration elements in accordance with principles well known in the art.

What is claimed is:

1. In charge transfer apparatus of the type adapted for storage and serial transfer of charge carriers localized in induced potential energy minima along a portion of a suitable storage medium by sequentially applying a plurality of differing potentials to successive portions of the surface of the medium through a plurality of electrodes, the improvement which includes
   means for providing bit regeneration in combination with said storage and serial transfer comprising:
   electrically floating means disposed in said apparatus in sufficient proximity to a first one of said electrodes for detecting the amount of charge carriers transferred under said first electrode at a predetermined time;
   means for disposing of the charge carriers after they have been detected;
   controllable means for injecting a controlled number of charge carriers at another location along said surface;
   gating means passively connected to the electrically floating means and disposed between the injecting means and a second one of the plurality of electrodes for causing the injecting means to inject charge carriers and for controlling the transfer of the newlyinjected carriers away from the injection means in response to the detection at the predetermined location; and
   means coupling the first and second electrodes together sufficiently that the same phase is applied to both in response to the applied potentials.

2. Apparatus as recited in claim 1 wherein the storage medium is a semiconductor of a first type semiconductivity.

3. Apparatus as recited in claim 2 wherein the detection means comprises a floating conductive electrode disposed between the surface of the storage medium and said first electrode and being insulated both from the storage medium and said first electrode.

4. Apparatus as recited in claim 2 wherein the detection means includes a first zone of a second type semiconductivity disposed within the body.

5. Apparatus as recited in claim 4 wherein:
   the injection means includes a second zone of the second type semiconductivity disposed within the body and spaced from said second electrode; and
   the gating means includes a control electrode disposed over the surface of the semiconductive material comprising the space between the injection means and said second electrode and being conductively connected to the first zone for controlling transfer of charge away from the second zone in response to the detection at the first zone.

6. Apparatus as recited in claim 5 additionally including means for applying a bias potential to the second zone.

7. Apparatus as recited in claim 6 wherein the bias potential is a DC bias potential.

8. Apparatus as recited in claim 5 including:
   a plurality of channels along which charge carriers are stored and serially transferrred, each of said channels being defined by a serially-disposed plurality of the electrodes; and
   means forming a pair of conduction paths, every second electrode in each channel being connected to a common one of the pair and the other electrodes in the channels being connected to the other one of the pair.

9. Apparatus as recited in claim 8 wherein:
   the first electrode is disposed in one of said channels; and
   the second electrode to which said gating control electrode is adjacent is disposed in another of said channels.

10. Apparatus as recited in claim 2 wherein the electrodes are field plate electrodes.

11. In charge transfer apparatus of the type adapted for storage and serial transfer of charge carriers localized in induced potential energy minima along a portion of a suitable storage medium by sequentially applying a plurality of differing potentials to successive portions of the surface of the medium through a plurality of electrodes, the improvement which includes
   means for providing bit regeneration in combination with said storage and serial transfer comprising:
   electrically floating means disposed between one of said electrodes and said storage medium and being insulated both from said one electrode and said storage medium for detecting the amount of charge carriers transferred under said one electrode;

means for disposing of said charge carriers after they have been detected;

controllable means for injecting charge carriers at another location along said surface; and gating means coupled to the detection means and disposed adjacent the injecting means for causing the injecting means to inject charge carriers and for controlling the transfer of charge carriers from the injecting means in response to the detection.

12. In charge transfer apparatus of the type adapted for storage and serial transfer of charge carriers localized in induced potential energy minima along a portion of a suitable storage medium by sequentially applying a plurality of differing potentials to successive portions of the surface of the medium through a plurality of electrodes, the improvement which includes means for providing regeneration of stored digital information in combination with said storage and serial transfer comprising:

detection means including an electrically floating first zone disposed in said medium in sufficient proximity to one of said electrodes for detecting the presence of charge carriers under said one electrode;

controllable means for injecting charge carriers at a portion of the surface remote from said one electrode; and gating means passively connected to the first zone and disposed between the injecting means and another of said electrodes for causing the injecting means to inject charge carriers and for controlling the transfer of charge carriers from the injecting means in response to the amount of charge carriers detected at the first zone.

13. Apparatus as recited in claim 12 wherein the first zone and the gating means are adapted such that an amount of charge carriers representing a logical "one" are transferred from the injecting means in response to a logical "zero" under said one electrode and such that an amount of charge carriers representing a logical "zero" are transferred from the injecting means in response to a logical "one" under said one electrode.

14. Apparatus as recited in claim 12 further including a plurality of channels along which charge carriers are stored and serially transferred, each of said channels being defined by a serially-disposed plurality of the electrodes, and wherein:

the detection means includes a plurality of separate detection zones, separate ones being disposed in relation to each of said channels for detecting charge carriers at a predetermined location in each channel; and the gating means includes a plurality of means disposed in series with respect to the injecting means so that charge carriers are allowed to be transferred away from the injecting means only if less than a predetermined number of charge carriers exist at each of the predetermined detecting locations along each of the channels, so that a logical NOR-function thereby is provided.

15. Apparatus as recited in claim 12 further including a plurality of channels along which charge carriers are stored and serially transferred, each of said channels being defined by a serially-disposed plurality of the electrodes, and wherein:

the detection means includes a plurality of separate detection zones, separate ones being disposed in relation to each of said channels for detecting charge carriers at a predetermined location in each channel; and the gating means includes a plurality of means disposed in parallel in relation to the injecting means so that charge carriers are prevented from being transferred away from the injecting means only if greater than a predetermined number of charge carriers exist at each of the predetermined detected locations along each of the channels, so that a logic NAND-function thereby is provided.

16. In charge transfer apparatus of the type adapted for storage and serial transfer of charge carriers localized in induced potential energy minima along a portion of a suitable storage medium by sequentially applying a plurality of differing potentials to successive portions of the surface of the medium through a plurality of electrodes, the improvement which includes means for providing bit regeneration in combination with said storage and serial transfer comprising:

means disposed in said apparatus for detecting the amount of charge stored therein at a predetermined location at a predetermined time;

means for disposing of the charge carriers of said predetermined location after they have been detected;

controllable means for injecting a controlled number of charge carriers at another location along said surface;

gating means coupled to the detection means and disposed adjacent the injecting means for causing the injecting means to inject charge carriers and for controlling the transfer of the newly-injected carriers away from the injection means in response to the detection at the predetermined location, and a plurality of channels along which charge carriers are stored and serially transferred, each of said channels being defined by a serially-disposed plurality of the electrodes, and wherein:

the detection means includes a plurality of separate detection means, separate ones being disposed in relation to each of said channels for detecting charge carriers at a predetermined location in each channel; and the gating means includes a plurality of means disposed in series with respect to the injecting means so that charge carriers are allowed to be transferred away from the injecting means only if less than a predetermined number of charge carriers exist at each of the predetermined detecting locations along each of the channels, so that a logical NOR-function thereby is provided.

17. In charge transfer apparatus of the type adapted for storage and serial transfer of charge carriers localized in induced potential energy minima along a portion of a suitable storage medium by sequentially applying a plurality of differing potentials to successive portions of the surface of the medium through a plurality of electrodes, the improvement which includes means for providing bit regeneration in combination with said storage and serial transfer comprising:

means disposed in said apparatus for detecting the amount of charge stored therein at a predetermined location at a predetermined time;

means for disposing of the charge carriers of said predetermined location after they have been detected;

controllable means for injecting a controlled number of charge carriers at another location along said surface;

gating means coupled to the detection means and disposed adjacent the injecting means for causing the injecting means to inject charge carriers and for controlling the transfer of the newly-injected carriers away from the injection means in response to the detection at the predetermined location, and a plurality of channels along which charge carriers are stored and serially transferred, each of said channels being defined by a serially-disposed plurality of the electrodes, and wherein:

the detection means includes a pluarlity of separate detection means, separate ones being disposed in relation to each of said channels for detecting charge carriers at a predetermined location in each channel; and the gating means includes a plurality of means disposed in parallel in relation to the injecting means so that carriers are prevented from being transferred away from the injecting means only if greater than a predetermined number of carriers exist at each of the predetermined detected locations along each of the channels, so that a logic NAND-function thereby is provided.

18. In semiconductor apparatus of the type adapted for the storage and serial transfer of charge carriers localized in induced potential energy minima along a surface portion of a body of a first type semiconductivity by sequentially applying a plurality of differing potentials to successive portions of the surface through field plate electrodes, the improvement which includes means for providing state inversion and bit regeneration in combination with said storage and serial transfer comprising:

an electrically floating first zone of a second type semiconductivity disposed within the body and adjacent to one of the field plate electrodes for sensing the number of charge carriers existing under said one field plate electrode;

a second zone of the second type semiconductivity disposed within the body and spaced from the first zone;

a first field plate control electrode disposed over and insulated from the semiconductive material comprising the space between the first and second zones;

a second field plate control electrode disposed over the surface and adjacent another of said field plate electrodes and conductively connected to the first zone;

and a third zone of the second type semiconductivity disposed within the body and adjacent the second field plate control electrode.

19. In a charge transfer apparatus of the type adapted for storage and serial transfer of charge carriers localized in induced potential energy minima along a portion of a suitable storage medium by sequentially applying a plurality of differing potentials to successive portions of the surface of the medium through field plate electrodes, the improvement which includes means for providing state inversion and bit regeneration in combination with said storage and serial transfer comprising:

means disposed in said apparatus adjacent one of the field plate electrodes for detecting the amount of charge stored therein at a predetermined time;

means in addition to the plurality of differing potentials for pre-biasing the detection means to a fixed reference level prior to each detecting operation for improved sensitivity;

means for decoupling the detection means from the pre-biasing means during a detection operation;

controllable means for injecting at another location within said apparatus a controlled amount of charge carriers of the type stored and transferred;

and gating means disposed between the injecting means and another of said field plate electrodes and passively connected to the detecting means for causing the injecting means to inject charge carriers and for controlling the transfer of charge carriers away from the injection means in response to the charge carriers detected by the detection means at said time.

* * * * *